(12) United States Patent  
Xuan et al.

(10) Patent No.: US 7,858,991 B2
(45) Date of Patent: Dec. 28, 2010

(54) LIGHT EMITTING DEVICE WITH MAGNETIC FIELD

(75) Inventors: Rong Xuan, Taipei County (TW); Chih-Hao Hsu, Hsinchu (TW); Wen-Yung Yeh, Hsinchu County (TW); Chen-Peng Hsu, Kaohsiung (TW); Chen-Kun Chen, Changhua County (TW); Kun-Fong Lin, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 9 days.

(21) Appl. No.: 12/351,815

(22) Filed: Jan. 10, 2009

(65) Prior Publication Data

US 2009/0179216 A1    Jul. 16, 2009

Related U.S. Application Data

(63) Continuation-in-part of application No. 12/117,747, filed on May 9, 2008, which is a continuation-in-part of application No. 12/146,418, filed on Jun. 25, 2008, now Pat. No. 7,767,996, which is a continuation of application No. 12/117,747, application No. 12/351,815, which is a continuation-in-part of application No. 12/168,073, filed on Jul. 4, 2008, now Pat. No. 7,759,671, which is a continuation-in-part of application No. 12/146,422, filed on Jun. 25, 2008, which is a continuation of application No. 12/117,747.

(60) Provisional application No. 61/020,397, filed on Jan. 11, 2008.

(51) Int. Cl.
*H01L 27/15* (2006.01)
*H01L 33/00* (2010.01)

(52) U.S. Cl. .................... 257/79; 257/E33.055; 257/99

(58) Field of Classification Search ............... 257/79, 257/89, 98, 99, 13, 82, E33.001, E33.035; 313/45, 506, 112; 362/105, 227, 555; 438/21, 438/46, 121, 122, 106
See application file for complete search history.

(56) References Cited

U.S. PATENT DOCUMENTS 4,450,460 A    5/1984    Morimoto (Continued)

FOREIGN PATENT DOCUMENTS

JP    9-83074    3/1997

(Continued)

OTHER PUBLICATIONS

Article Titled "Hydrogen Atom in a Strong Magnetic Field" jointly authored by Yafet et al. in J. Phys. Chem. Solids. Pergamon Press 1956. vol. 1,(pp. 137-142.).

(Continued)

*Primary Examiner*—Thomas L Dickey
*Assistant Examiner*—Nikolay Yushin
(74) *Attorney, Agent, or Firm*—Jianq Chyun IP Office

(57) ABSTRACT

A light emitting device with magnetic field includes a light emitting device, a thermal conductive material layer and a magnetic layer. The thermal conductive material layer is coupled with the light emitting device to dissipate heat generated by the light emitting device. The magnetic layer is coupled with thermal conductive material layer to produce a magnetic filed on the light emitting device.

16 Claims, 11 Drawing Sheets

U.S. PATENT DOCUMENTS

| | | | |
|---|---|---|---|
| 6,788,541 B1 * | 9/2004 | Hsiung | 361/719 |
| 2006/0124953 A1 | 6/2006 | Negley et al. | |
| 2009/0126922 A1 * | 5/2009 | Vetrovec | 165/185 |

FOREIGN PATENT DOCUMENTS

| | | |
|---|---|---|
| JP | 9-219564 | 8/1997 |
| WO | 2006-044027 | 4/2006 |

OTHER PUBLICATIONS

Article Titled "Electron transport in MOVPE grown InGaN/GaN MQW in moderate magnetic field" jointly authored by B. Arnaudov et al., in 10th European Workshop on MOVPE, Lecce (Italy) Jun. 8-11, 2003.

"Search Report of PCT counterpart application", issued on Apr. 2, 2009, p1-p16.

* cited by examiner

LIGHT EMITTING DEVICE WITH MAGNETIC FIELD

CROSS-REFERENCE TO RELATED APPLICATION

This application claims the priority benefit of U.S. provisional application Ser. No. 61/020,397, filed on Jan. 11, 2008. This application is also a continuation-in-part of and claims priority benefits of U.S. non-application Ser. No. 12/117,747, filed on May 9, 2008, U.S. non-application Ser. No. 12/146, 418, filed on Jun. 25, 2008, U.S. non-application Ser. No. 12/168,073, filed on Jul. 4, 2008, and U.S. non-application Ser. No. 12/146,422, filed on Jun. 25, 2008. The prior application Ser. No. 12/117,747 and Ser. No. 12/168,073 claim the priority benefit of the said provisional application Ser. No. 61/020,397. The prior application Ser. No. 12/146,418 and Ser. No. 12/146,422 are continuation application of the said non-provisional application Ser. No. 12/117,747 and also claim the priority benefit of the said provisional application Ser. No. 61/020,397. The entirety of each of the above-mentioned patent applications is hereby incorporated by reference herein and made a part of this specification.

BACKGROUND OF THE INVENTION

1. Field of Invention

The present invention relates to light emitting technology. More particularly, the present invention relates to light emitting device with magnetic filed being applied.

2. Description of Related Art

Light emitting device, such as light emitting diode (LED) can emit light due to the driving of electron current through the active layer of the light emitting diode. However, if current density is not uniformly distributed to the whole light emitting area, the light uniformity is reduced. Even further, the non-transparent top electrode, in conventional design, is usually positioned at the center region of the light emitting area. In this manner, the current density under the top electrode is larger than the other region and can emit more light. However, the emitted light under the top electrode is blocked since the top electrode is not transparent to the light. The top electrode of the conventional LED blocks the emitted light at the central region with the highest intensity, resulting in reduction of the output light.

Even further, since the LED generates heat when in operation, it affects the performance and lifetime. How to design the LED is still under development in the field of the art.

SUMMARY OF THE INVENTION

The invention provides a light emitting device with magnetic field including a light emitting device, a thermal conductive material layer and a magnetic layer. The thermal conductive material layer is coupled with the light emitting device to dissipate heat generated by the light emitting device. The magnetic layer is coupled with thermal conductive material layer to produce a magnetic filed on the light emitting device.

The invention provides a light emitting device with magnetic field including at least one light emitting device, a silicon thermal conductive layer, a magnetic layer and a heat dissipation layer. The light emitting device is disposed on the silicon thermal conductive layer, wherein multiple conductive plugs are formed in the silicon thermal conductive layer for connection to multiple electrodes of the light emitting device. The magnet layer is under the silicon thermal conductive layer to produce a magnetic field on the light emitting device. The heat dissipation layer surrounds the magnetic layer at a side and a bottom and also contacts the silicon thermal conductive layer. The heat dissipation layer also has multiple electrodes in connection with the conductive plugs for providing an operation voltage to the light emitting device.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
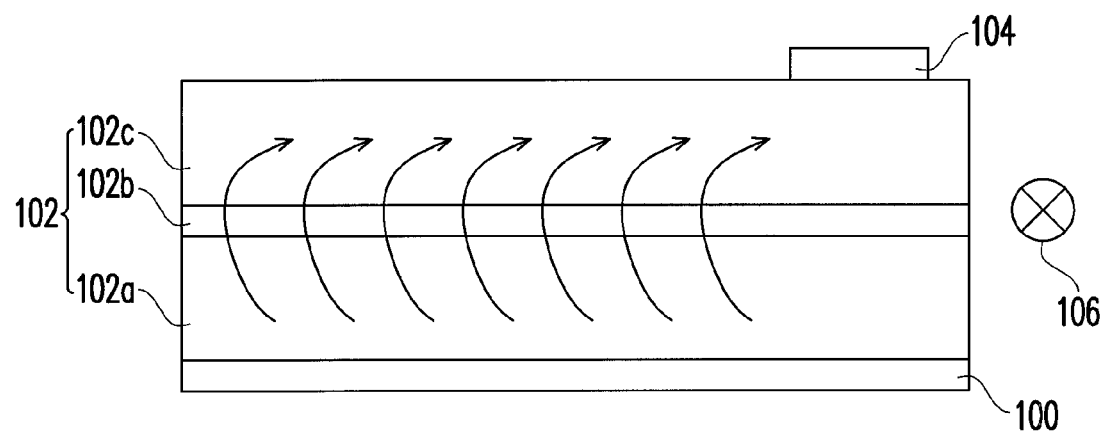
FIG. 1 is a drawing, schematically illustrating a light emitting device associating with magnetic field, according to an embodiment of the invention.

The invention provides a light emitting device, which has magnetic layer for providing magnetic field to the light emitting unit, such as LED. Using the magnetic field to change the current density of the driving current, more uniformity for the emitting light and reducing the light blocking effect by the top electrode can be achieved. In addition, the invention can adapt the magnetic layer, and further integrate the heat dissipation layer, so as to achieve the dissipation effect.

In physical phenomenon, the Hall effect is well known that when a current flow through a conductive line and an external magnetic field is applied transversely, then the path of the current, such as the electron current, is also transversely shifted due to magnetic Lorenz force of $F=q*v*B$. The present invention involves the consideration of the Hall effect and implements the Hall effect into the LED.

Additionally, when considering the quantum effect, the magnetic field perpendicular to the chip surface, such as being perpendicular to the active layer, can also improve the conversion efficiency for producing light for the light emitting device. The basic mechanism is that the perpendicular magnetic filed can increase the binding energy in the active region, resulting in enhancing the probability of carrier combination. In more detail, the biding energy is rather close to conduction band. Usually, the improvement is more significant for the light emitting device having the energy difference between the binding energy and the conduction band larger than 25 meV at room temperature. For example, the light emitting device with that energy difference includes, for example, the inorganic semiconductor material with the nitride base, such as GaN or the organic semiconductor materials, such as phosphorescence material, fluorescent material, and so on. The phosphorescence material can be, for example, red, green, blue, or dendrimer. The fluorescent material can be, for example, red, green, blue, yellow or white.

The binding energy in the semiconductor material would increase as the increase of the perpendicular magnetic field. In other words, the present invention also propose that the magnetic field perpendicular to the active layer of the light emitting device is applied to extra increase more efficiency of carrier combination, so as to improve the light emitting efficiency. In several studies by taking GaN chip as the example with several pumping powers of laser light, the measured photoluminescent (PL) is observed. It turns out that the perpendicular magnetic field can significantly improve the PL and can be even up to 27% of improvement. The magnetic field is substantially perpendicular to the active layer of the light emitting device. However, the light emitting device can be the horizontal type with two electrodes at the same side of the semiconductor stack or the vertical type with two electrodes at the opposite sides of the semiconductor stack.

Even further, the invention in associating with the magnetic layer further integrates heat dissipation, so as to protect the light emitting device.

FIG. 1 is a cross-sectional view, schematically illustrating a structure of a light emitting diode with the magnetic field, according to an embodiment of the present invention. In FIG. 1, a light emitting diode is taken as the example. The light emitting diode includes, for example, a bottom electrode 100, a light-emitting structure 102, a top electrode 104. The light-emitting structure 102 includes, for example, a first doped semiconductor layer 102a, such as P-dope layer, an active layer 102b for emitting light based on combination of electrons and electron-holes, and another doped semiconductor layer 102c, such as N-doped layer. The top electrode 104 can be, for example, not positioned at the center of the light emitting area 108.

When in operation, the current is flowing from the bottom electrode 100 to the top electrode 104. However, if an external magnetic field in a direction, such as an indication to go in the paper as indicated by notion 106, is transversely applied, the Lorenz force is produced to shift and spread the current. Here, FIG. 1 is an example. The conductive types of electrodes and the direction of magnetic field can be changed according to the actual design, while the concept remains the same. As a result, the current are transversely shifted and can still flow from the bottom electrode to the top electrode, which is at the side region of the light emitting area 108. The driving current can more effectively cause the active layer 102b to emit light.

Figure 2A:
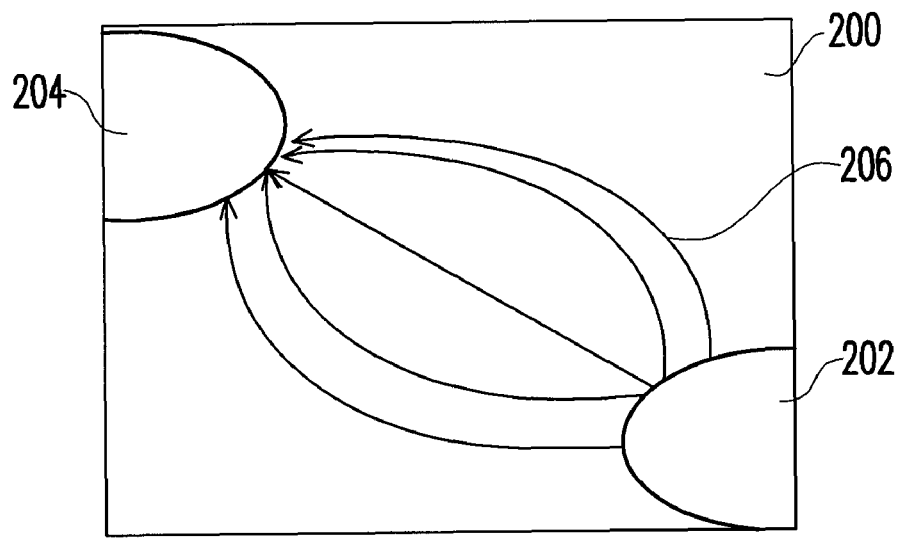
FIGS. 2A-2B are top views, schematically illustrating another light emitting device associating with magnetic field, according to an embodiment of the invention.
Figure 2B:
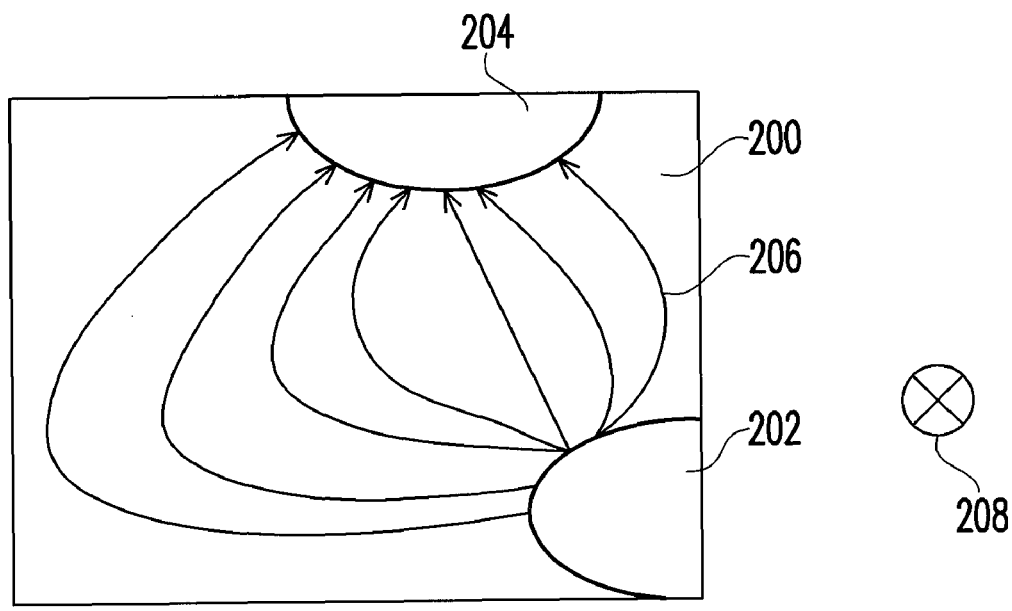

FIGS. 2A-2B are top views, schematically illustrating a mechanism for a structure of a light emitting diode with the magnetic field, according to an embodiment of the present invention. In FIG. 2A, taking a light emitting structure 200 in a rectangular shape as an example, two electrodes 202 and 204 are located at the diagonal corners. When a proper voltage is applied, the current 206 is concentrated in a region having the shortest path, causing non-uniform current density. In FIG. 2B, when a magnetic field 208 is applied at a direction perpendicular to the light emitting structure 200, then the Lorenz fore causes the current 206 to shift. As a result, the current 206 can spread and more evenly distribute in the whole area of the light emitting structure 200. This indicates that the light emitting area can increase and the light is not over concentrated to a local area. However, the location of the electrode 204 is changed in accordance with the applied magnetic field.

In order to have the light emitting device with better structure integration, for an LED, the structure integrates the magnetic layer to produce the magnetic field to be applied. Since the LED generates heat in operation, the heat affects the performance and lifetime of LED. The light emitting device of the invention, therefore, is implemented with magnetic layer but also considers the issue of heat dissipation. Several embodiments are provided to describe the invention. In addition, the provided embodiments can be properly combined to each other.

Figure 3:
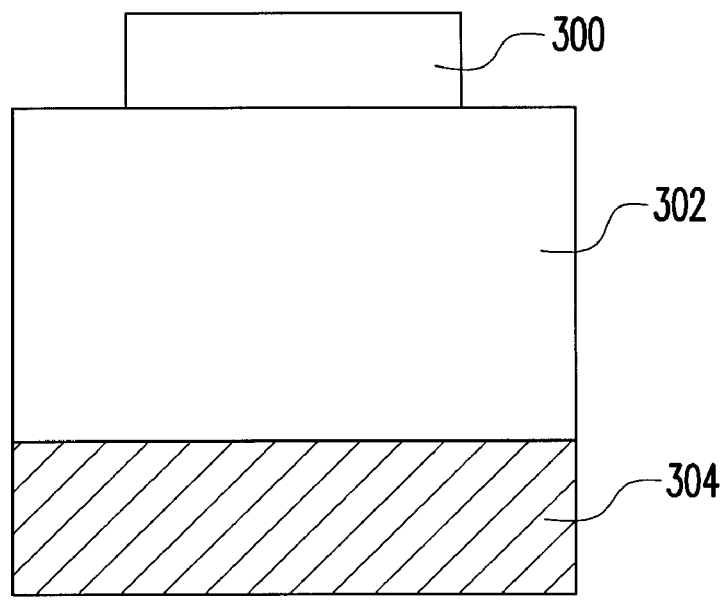
FIG. 3 is a cross-section view, schematically illustrating a light emitting device with magnetic filed, according to an embodiment of the invention.

FIG. 3 is a cross-section view, schematically illustrating a light emitting device with magnetic filed, according to an embodiment of the invention. In FIG. 3, the basic structure of the light emitting device includes a light emitting device 300, a thermal conductive layer 302 and a magnetic layer 304. The structure of the light emitting device 300 is, for example, a usual LED, which can be the structure as shown in FIG. 1 having two electrode layers on both sides, or the structure shown in FIG. 2 having two electrodes at the same side. The LED structure can be known by the one with ordinary skill in the art and is not further described in detail. The thermal conductive layer 302 is coupled with the light emitting device 300, so as to dissipate the generated heat from the light emitting device 300 away. The magnetic layer 304 is coupled with the thermal conductive layer 302 to provide a magnetic field on the light emitting device 300. The direction of the magnetic field is depending on the magnetic material being used and can exert the magnetic field on the light emitting device 300, so as to have the effect of shifting the distribution of driving current.

The effect of the thermal conductive layer 302 is dissipating heat, so as to conduct the heat out and dissipate it. The thermal conductive material can be, for example, Cu, Ag, Au, Al, Pt, ceramic material, the oxide larger coefficient for dissipating heat, or a combination thereof. The thermal conductive material can be in accordance with the need of magnetic field, such as using the paramagnetic material or ferromagnetic material, such as metal of Fe, Co, Ni, Al, Pt, tin, . . . , and so on; or other alloy or compound. In this manner, the magnetic field generated by the magnetic layer can be easily guided into the light emitting device. If the thermal dissipating material is diamagnetism, such as Au, Ag, Cu, C or Pb, then it needs to reduce the thickness, so as to avoid reducing the magnetic effect. In addition, in general, the area of the thermal conductive layer 302 is larger than the area of the magnetic layer, so that the heat dissipating path does not need to pass the magnetic layer. The thermal resistance is can be reduced and the thermal dissipation effect can be improved.

Figure 4:
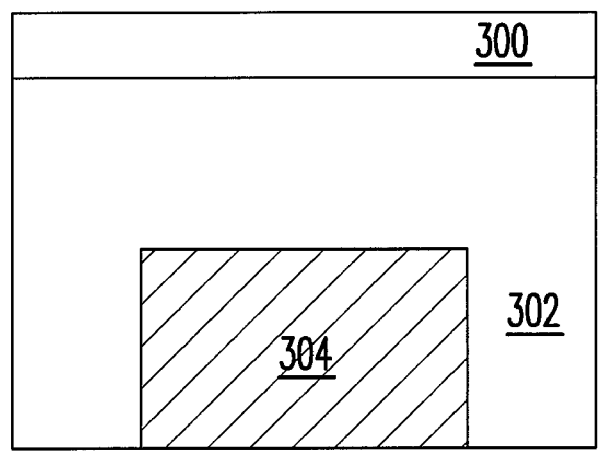
FIG. 4 is a cross-section view, schematically illustrating a light emitting device with magnetic filed, according to another embodiment of the invention.

FIG. 4 is a cross-section view, schematically illustrating a light emitting device with magnetic filed, according to another embodiment of the invention. In FIG. 4, the magnetic layer 304 is embedded within the thermal conductive layer 302 of the embodiment. In other words, the thermal conductive layer 302 surrounds the magnetic layer 304 at side and the top surface. In this structure, it can allow the magnetic layer 304 to be closer to the light emitting device 300, so as to provide stronger magnetic field on the light emitting device 300.

Figure 5:
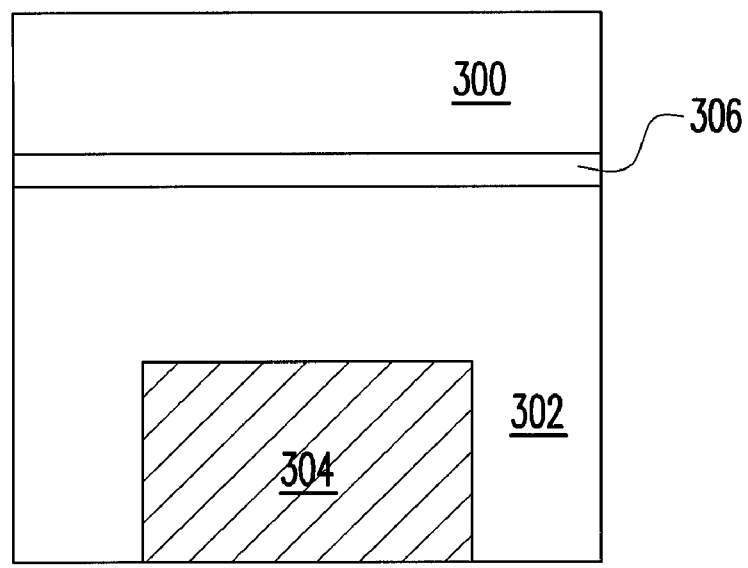
FIGS. 5-22 are the cross-section views, schematically illustrating light emitting devices with magnetic filed, according to embodiments of the invention.

FIG. 5 is the cross-sectional view, schematically illustrating light emitting devices with magnetic filed, according to an embodiments of the invention. In FIG. 5, it continues from the structure in FIG. 4. According to the light emitting mechanism of the light emitting device 300, the light emitting device 300 can further include a reflection layer 306 at bottom. The reflection layer 306 is also one of parts of the basic structure in light emitting device 300, as can be known by the one with ordinary skill in the art. The reflection layer 306 can reflect the light in backward direction into the forward direction. The reflection layer 306 is usually also a part of the light emitting device 300.

Figure 6:
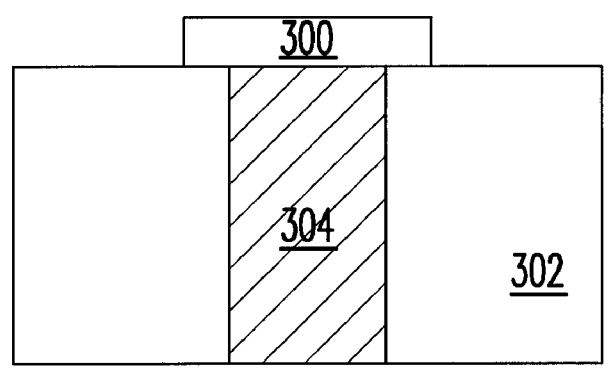

FIG. 6 is the cross-sectional view, schematically illustrating light emitting devices with magnetic filed, according to another embodiments of the invention. In FIG. 6, with the same principle, it is a structure in another arrangement. The magnetic layer 304 is directly contacting with the light emitting device 300, so as to provide the intended magnetic field to the light emitting device 300. The thermal conductive layer 302 also contacts the light emitting device 300 and surrounds the peripheral side of the magnetic layer 304. In other words, the thermal conductive layer 302 has an opening, exposing the light emitting device 300. The magnetic layer 304 fills into the opening.

Figure 7:
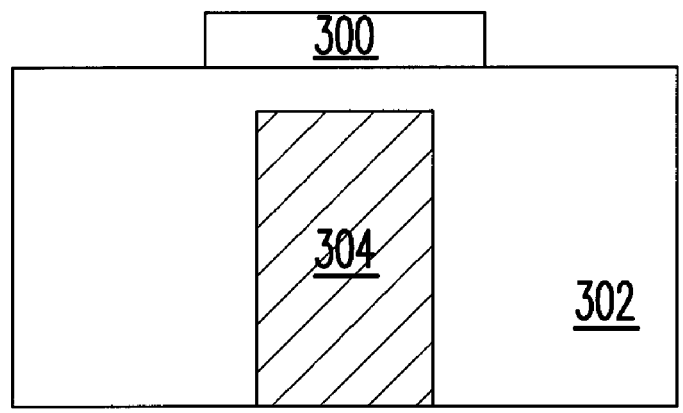

FIG. 7 is the cross-sectional view, schematically illustrating light emitting devices with magnetic filed, according to an embodiments of the invention. Referring to FIG. 7, in consideration of better performance for heat dissipation and maintaining the need of magnetic strength, the thermal conductive layer 302 between the light emitting device 300 and the magnetic layer 304 can have a certain thickness, so that the light emitting device 300 still has sufficient contact area with the thermal conductive layer 302. For the difference between the embodiments in FIG. 7 and FIG. 4, they are basically the same in structure. However, the thermal conductive layer 302 between the light emitting device 300 and the magnetic layer 304 can have difference, and the fabrication process can be different s well. For example, the magnetic layer 304 can be further closer to the light emitting device 300, so as to provide stronger effect of magnetic field.

Figure 8:
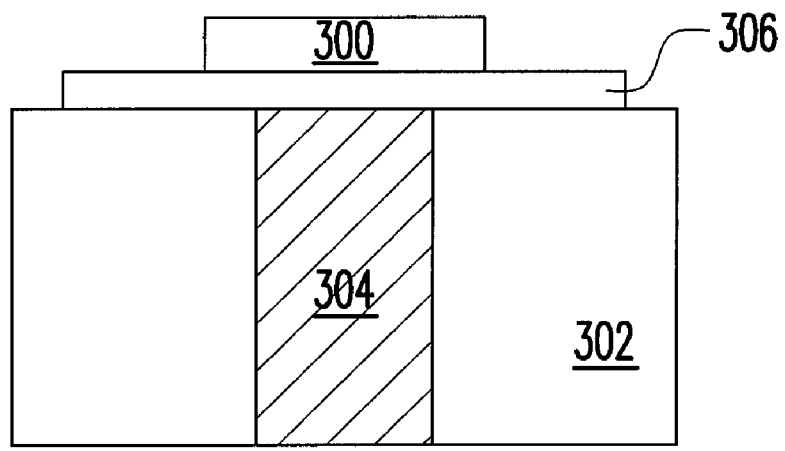

FIG. 8 is the cross-sectional view, schematically illustrating light emitting devices with magnetic filed, according to an embodiments of the invention. As previously mentioned, the embodiments in the invention can be further properly combined. The magnetic light emitting device in FIG. 8, for example, is the combination of the embodiment f FIG. 5 and FIG. 7, in which a reflection layer 306 is disposed between the light emitting device 300 and the magnetic layer 304.

Figure 9:
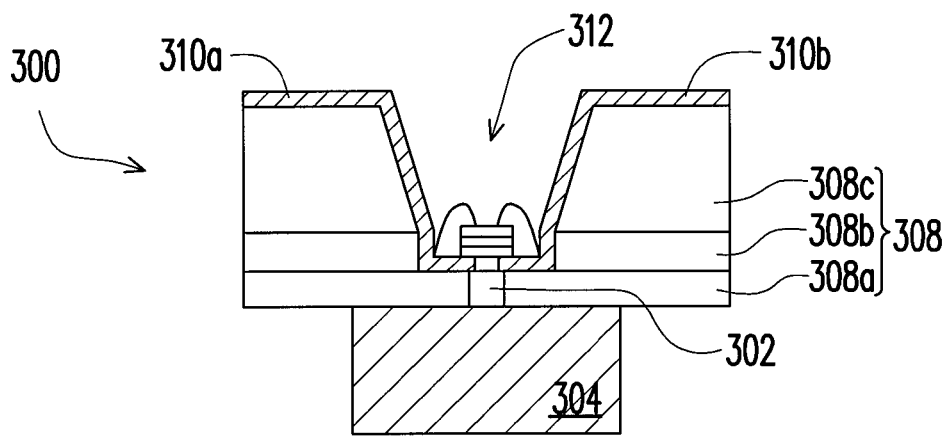

FIG. 9 is the cross-sectional view, schematically illustrating light emitting devices with magnetic filed, according to an embodiments of the invention. In FIG. 9, in order to be more efficient for fabrication and reducing the thickness, the LED chip 312 be packaged with silicon on insulator (SOI) substrate 308. The SOI substrate 308 includes bottom silicon layer 308a, insulating layer 308b, and top silicon layer 308c. A concave opening is formed in the top silicon layer 308c and the insulating layer 308b to expose the bottom silicon layer 308a. Two electrode layers 310a and 310b are formed on the sidewall of the concave opening. The two electrodes and the two electrode layers 310a and 310b of the LED chip 312 are respectively connected by bonding wire. The electrode layers 310a and 310b, for example, are metal coating layers. In the embodiment, the bottom silicon layer 308a and the top silicon layer 308c have thermal conducting effect, and then are serving as heat dissipation layer, simultaneously. In addition, if it is necessary, a conductive plug 302 can be formed in the bottom silicon layer 308a.

Figure 10:
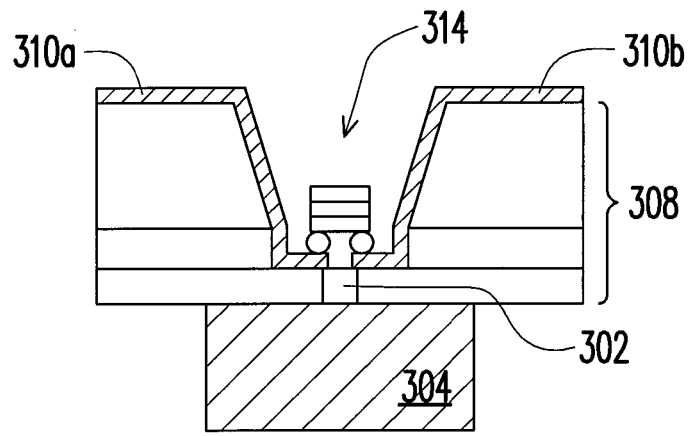

FIG. 10 is the cross-sectional view, schematically illustrating light emitting devices with magnetic filed, according to an embodiments of the invention. In FIG. 10, it is similar to the structure in FIG. 9. The difference is that the chip packaging manner. The packaging structure of the chip 314 in FIG. 10 is, for example, flip-chip process by connection of the bonding pad and the bump but not connected to the electrode layers 310a and 310b by the bonding wire.

Figure 11:
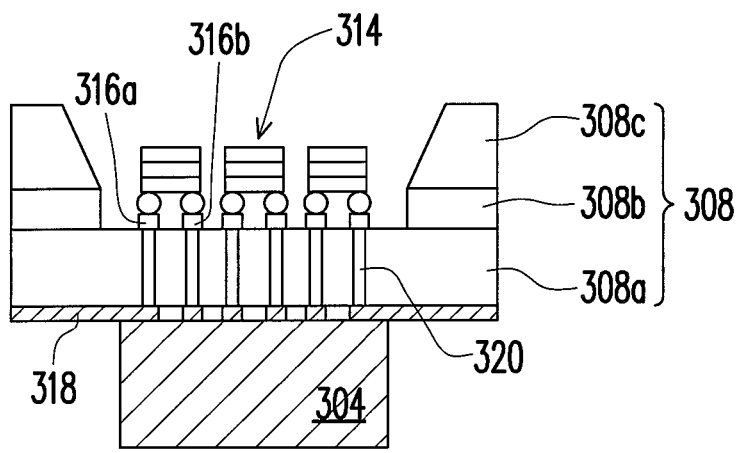

FIG. 11 is the cross-sectional view, schematically illustrating light emitting devices with magnetic filed, according to the embodiments of the invention. Referring to FIG. 11, with the same principle, the groove of the SOI substrate 308 can be used to adapt multiple LED chips 314. The electrode layer 316a and 316b can be changed as the connection pad. Several conductive plug 320 are formed in the bottom silicon layer 308a, to extend the electrode layers 316a, 316b of the pad to the other side of the bottom silicon layer 308a. The lower surface and the upper surface of the bottom silicon layer 308a are formed with electrode layer 318 for connecting those LED chips 314, so that the operation voltages can be externally applied to the LED chips 314. The magnetic layer 304 is, for example, adhered on the electrode layer 318 and the bottom silicon layer 308a.

Figure 12:
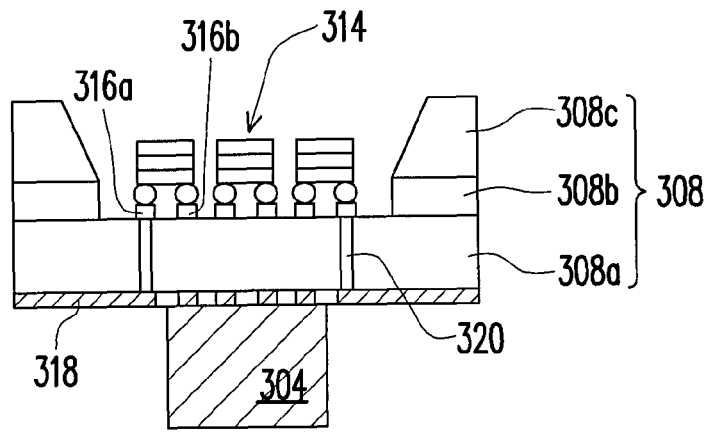

FIG. 12 is the cross-sectional view, schematically illustrating light emitting devices with magnetic filed, according to the embodiments of the invention. In FIG. 12, it is similar to the design in FIG. 11 but the connection of the LED chips is in series. In this situation, it just needs the two conductive plugs 320 of the two electrodes in left and right. The connection circuit can be formed on the surface of the bottom silicon layer 308a. In other words, the connection circuit can be achieved according to the actual need, and can be known by the one skilled in the art. The descriptions in detail are omitted. The features of the embodiment is using silicon of the SOI substrate 308 got thermal conductive material and the magnetic layer 304 is taken to have the effect for applying magnetic field.

In accordance with the implementation principle of the thermal conductive material and the magnetic layer, the invention to package the LED chip has several methods.

Figure 13:
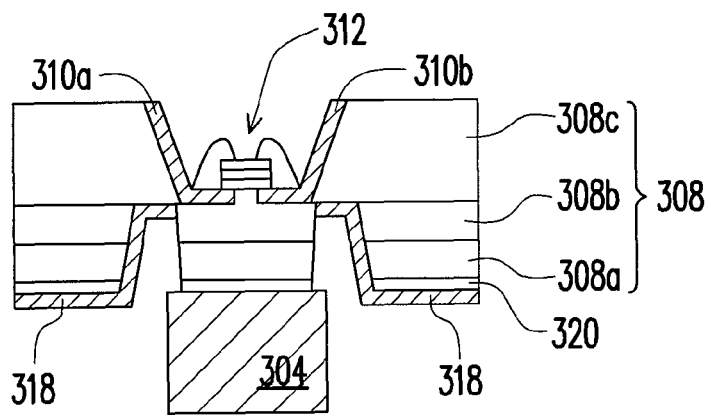
Figure 14:
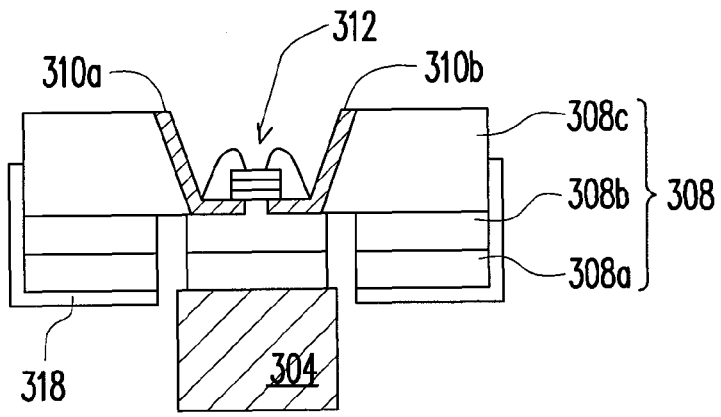
Figure 15:
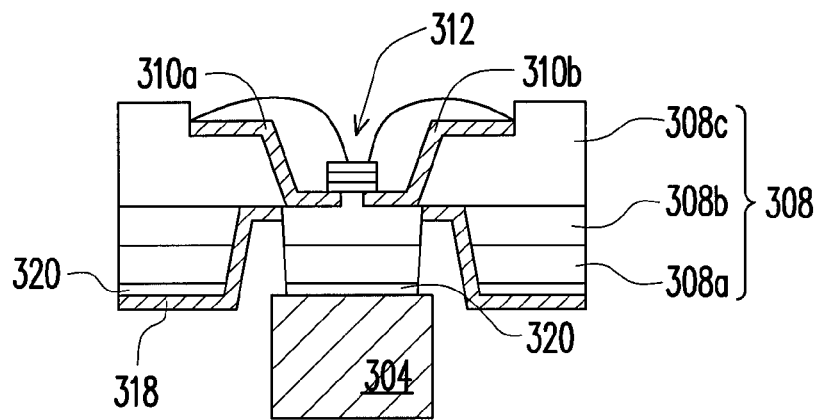

FIG. 13-15 are the cross-sectional view, schematically illustrating light emitting devices with magnetic filed, according to the embodiments of the invention. In FIG. 13, with respect to the bonding wire of the packaging process, the insulating layer 308b and the bottom silicon layer 308a of the SOI substrate 308 can also be formed with a concave, so that the electrically conductive dissipation layer 319 can be much closer to the heat source 312. For example, the thermal conductive layer 321 can be further implemented with the electrically conductive dissipation layer 319, disposed on the bottom silicon layer 308a. In FIG. 13, the chip can be, for example, connected to the electrode layer 310a and 310b by the bonding wires, and the electrically conductive dissipation layer 319 is not serving as the electrode. However, in accordance with the actual processes, the electrically conductive dissipation layer 319 can be connected to the electrode layers 310a and 312b to serve as the electrode layer, as well.

FIG. 14, the concave opening in the SOI substrate 308 can be an opening in the insulating layer 308b and the bottom silicon layer 308a. The concave opening this opening expose the top electrode layer 308c but no metal layer on the surface of the concave opening. Further in FIG. 15, the shape of the concave opening of the SOI substrate 308 can also have some modification. For example, the concave opening in the top silicon layer 308c can be in two-stage structure. This change is in packaging but the basic design principle of the invention still remains.

Figure 16:
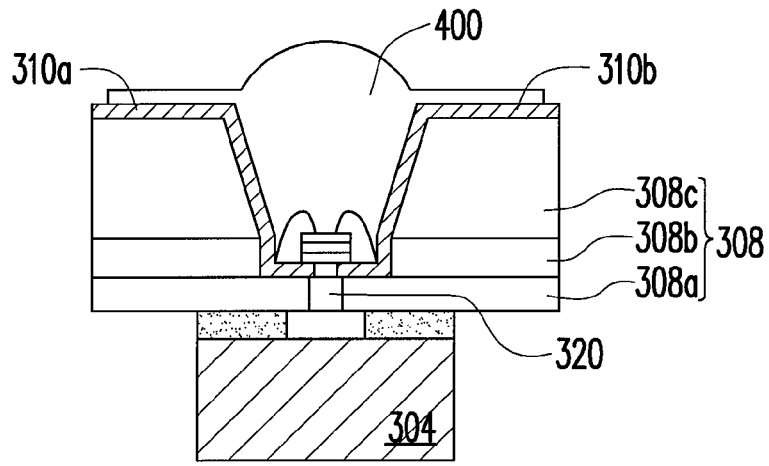
Figure 17:
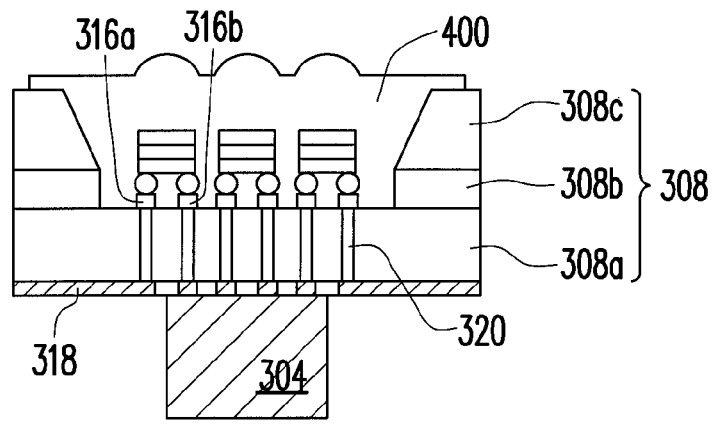

FIGS. 16-17 are the cross-sectional view, schematically illustrating light emitting devices with magnetic filed, according to the embodiments of the invention. In FIG. 16, it is for example based on the structure in FIG. 9. The concave opening of the SOI substrate 308 can be filled with conductive glue 400, so that the light emitted from the LED chip can be more concentrated and improve the light emitting efficiency. In FIG. 17, it is based on the structure in FIG. 11, the conductive glue 400 is additionally implemented.

As previously described, the embodiments provided in the invention can be combined each other into another embodiment. The provided embodiments are separately implemented.

Figure 18:
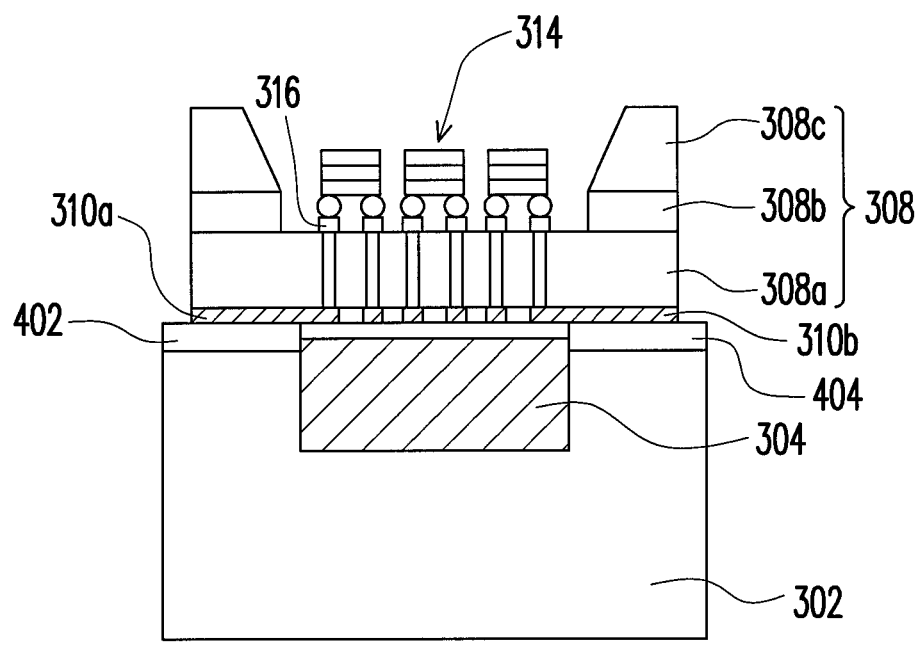
Figure 19:
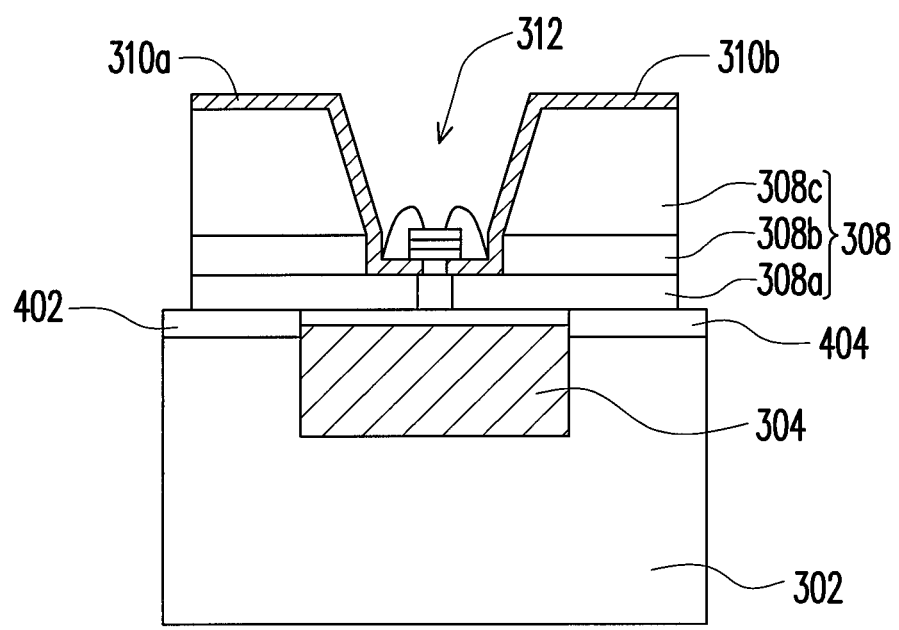
Figure 20:
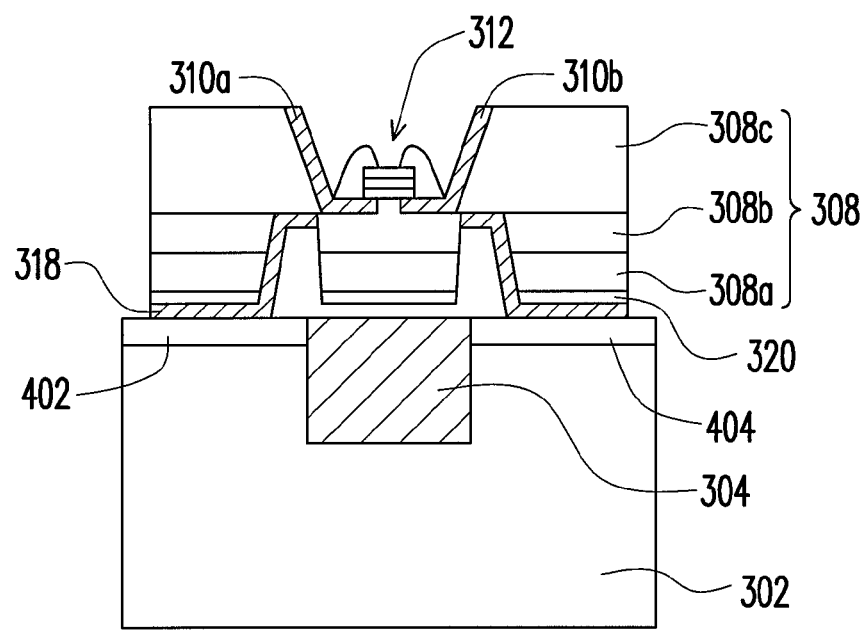

FIGS. 18-20 are the cross-sectional view, schematically illustrating light emitting devices with magnetic filed, according to the embodiments of the invention. In FIG. 18, it is for example further based on the structure of FIG. 11 and the thermal conductive layer 302 is further implemented to serve as the heat sink, which surrounds the magnetic layer 304. Electrode layers 402, 404 are further formed on the heat sink 302 to connect to the electrode layer 310a, 310b. Therefore, the operation voltages can be applied from the electrode layers 402, 404 on the heat sink 302. In FIG. 19, the embodiment can also, for example, takes the bonding packing structure and the further implements the conductive layer 302 to serve as the heat sink. In FIG. 20, the embodiment can be, for example, based on the structure n FIG. 13 and further includes the conductive layer 302 to serve as the heat sink. Here, except that the silicon layer in the SOI substrate 308 can be used as the thermal conductive material, the thermal conductive layer 302 is further implemented.

Figure 21:
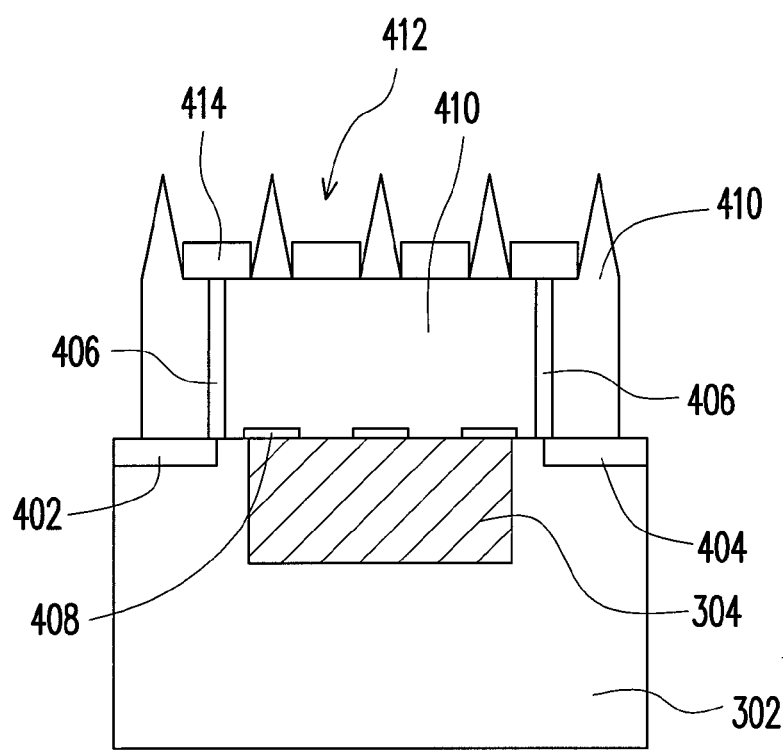
Figure 22:
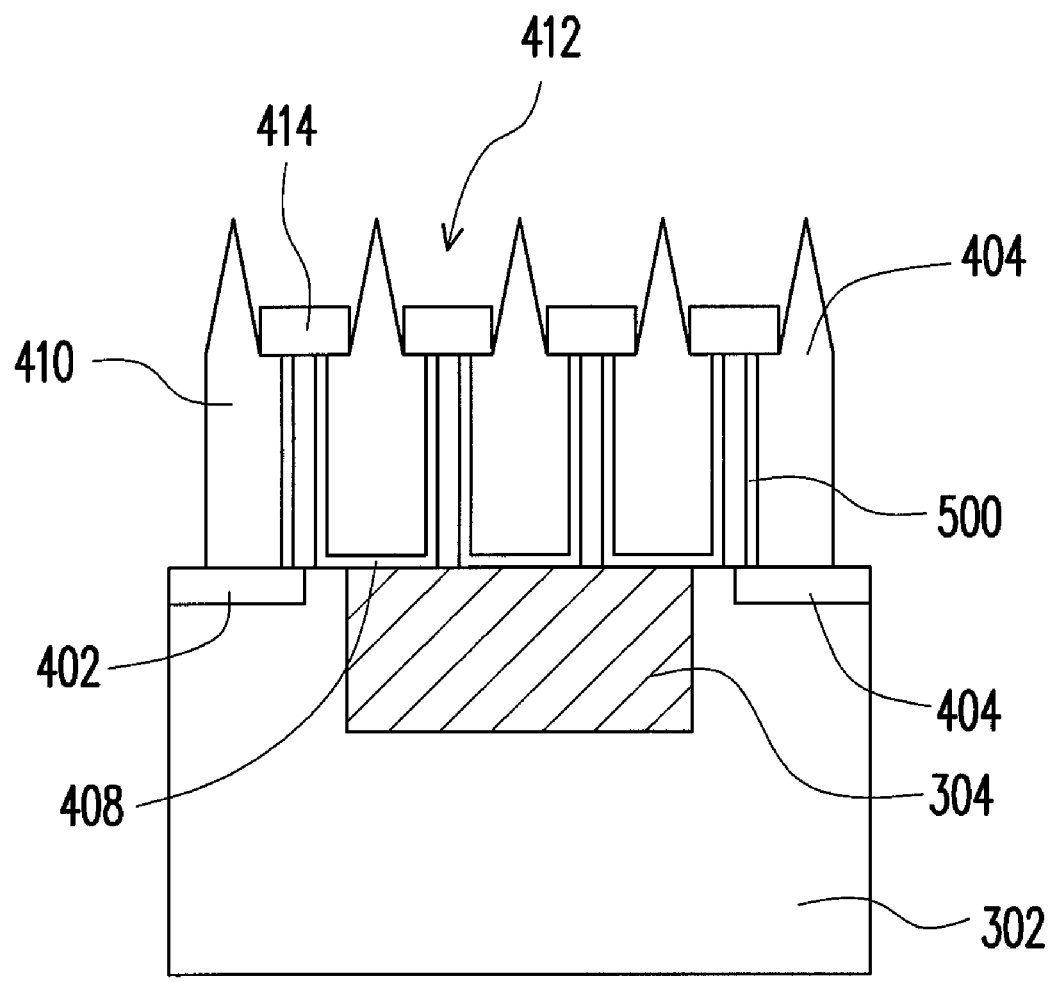

FIGS. 21-22 are the cross-sectional view, schematically illustrating light emitting devices with magnetic filed, according to the embodiments of the invention. In FIG. 21, the SOI substrate 410 serving as the base can have multiple grooves 412 to implement the LED chips 414. The detail is similar to the previous descriptions, in which the SOI substrate 410 uses the grooves 412 to adapt the LED chips 414. The conductive plugs 406 in the SOI substrate 410 are connected to the electrode layers 402, 404 on the heat sink 32. If it is needed, for example, the interconnect circuit layer 408 is formed on the heat sink 302 for the connection. In FIG. 22, the connection manner for the LED chip 414 can also be modified in different ways. For example, the conductive plug 500 in the SOI substrate 410 is electrically connected with the interconnection layer 408 on the heat sink 302 and the magnetic layer 304. As a result, the LED chips 414 are connected in parallel.

Several embodiments are provided in the invention. However, the invention is not just limited to the provided embodiments. The embodiment can also be combined to each other. The invention proposes that the magnetic material is used to provide the needed magnetic field on the LED, so as to improve the light emitting efficiency. Further, in accordance with the thermal dissipation mechanism, the thermal conductive layer is used, in which the thermal conductive material without significantly reducing the magnetic field can be used. In addition, the silicon layer in the SOI substrate can also serve as the thermal conductive material.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A light emitting device with magnetic field, comprising:
a light emitting device;
a thermal conductive material layer, coupled with the light emitting device; and
a magnetic layer, coupled with thermal conductive material layer,
wherein the thermal conductive layer contacts a lower surface of the light emitting device and has an opening to expose the light emitting device, and the magnetic layer fills the opening to contact the light emitting device.

2. The light emitting device with magnetic field of claim 1, wherein the thermal conductive layer is disposed between the light emitting device and the magnetic layer.

3. The light emitting device with magnetic field of claim 2, wherein the thermal conductive layer is surrounding the magnetic layer at side.

4. The light emitting device with magnetic field of claim 1, wherein the light emitting device further comprises a reflection layer at a bottom in contact with the thermal conductive layer.

5. The light emitting device with magnetic field of claim 1, wherein the light emitting device includes a light emitting diode chip.

6. A light emitting device with magnetic field, comprising:
a light emitting device;
a thermal conductive material layer, coupled with the light emitting device; and
a magnetic layer, coupled with thermal conductive material layer,
wherein the light emitting device comprises:
a substrate, being a stack of a first silicon layer, an insulating layer, and a second silicon layer, wherein the first silicon layer has a concave opening to expose the insulating layer, and the second silicon layer serves as the thermal conductive layer in contact with the magnetic layer; and
at least one light emitting diode, packaged on the insulating layer within the concave opening.

7. The light emitting device with magnetic field of claim 6, further comprising a metal padding layer on the second silicon layer, wherein the second silicon layer has a plurality of thermal conductive plug in contact with the light emitting diode and the metal padding layer, so that a heat generated by the light emitting diode is conducted out by the metal padding layer.

8. The light emitting device with magnetic field of claim 6, wherein the insulating layer and the second silicon layer in the substrate further have an opening to expose a back of the first silicon layer, and the light emitting device with magnetic field further comprises a metal padding layer formed on the opening at a sidewall and a bottom surface, extending over a periphery region of the opening on a surface of the second silicon layer.

9. The light emitting device with magnetic field of claim 6, wherein the insulating layer and the second silicon layer in the substrate has an opening to expose a back of first silicon layer, and the light emitting device with magnetic field further comprises a metal padding layer formed on a surface of the second silicon layer at a region other than the opening.

10. The light emitting device with magnetic field of claim 6, wherein the surface of the concave opening of the first silicon layer has multiple electrode layers coupled with multiple electrodes of the light emitting diode, so that an operation voltage is applied to the light emitting diode.

11. The light emitting device with magnetic field of claim 10, further comprising a filled structure in the concave opening.

12. The light emitting device with magnetic field of claim 11, further comprising an electrode layer structure disposed under the second silicon layer, wherein the second silicon layer has multiple electrically conductive plug for connecting the light emitting diode to the electrode structure layer.

13. A light emitting device with magnetic field, comprising:
at least one light emitting device;

a silicon thermal conductive layer, wherein the light emitting device is disposed on the silicon thermal conductive layer, and the silicon thermal conductive layer has multiple conductive plugs for connection to multiple electrodes of the light emitting device;

a magnetic layer, under the silicon thermal conductive layer; and a heat dissipation layer, surrounding the magnetic layer at a side and a bottom and also contacting the silicon thermal conductive layer, wherein the heat dissipation layer also has multiple electrode layers in connection with the conductive plugs for providing an operation voltage to the light emitting device.

14. The light emitting device with magnetic field of claim 13, wherein the silicon thermal conductive layer has at least a concave region to adapt the light emitting device.

15. A light emitting device with magnetic field, comprising:

a light emitting device;

a thermal conductive material layer, coupled with the light emitting device; and a magnetic layer, coupled with thermal conductive material layer, wherein the thermal conductive layer contacts a lower surface of the light emitting device and has a concave, and the magnetic layer fills the concave below the light emitting device with contacting to the concave.

16. The light emitting device with magnetic field of claim 15, wherein the magnetic layer has an exposed surface, coplanar with an exposed bottom surface of the thermal conductive layer.

* * * * *